United States Patent [19]

Narayan

[11] Patent Number: 5,406,123
[45] Date of Patent: Apr. 11, 1995

[54] SINGLE CRYSTAL TITANIUM NITRIDE EPITAXIAL ON SILICON

[75] Inventor: Jagdish Narayan, Raleigh, N.C.

[73] Assignee: Engineering Research Ctr., North Carolina State Univ., Raleigh, N.C.

[21] Appl. No.: 897,033

[22] Filed: Jun. 11, 1992

[51] Int. Cl.⁶ ............... H01L 29/12; H01L 29/40; H01L 29/161
[52] U.S. Cl. ............... 257/767; 257/383; 257/486; 257/751; 257/913; 257/190
[58] Field of Search ............... 257/913, 383, 486, 751, 257/763, 767, 770, 18, 19, 190

[56] References Cited

U.S. PATENT DOCUMENTS

4,948,459  8/1990  van Laarhoven et al. ......... 156/643
5,022,958  6/1991  Favreau et al. .................. 156/643

OTHER PUBLICATIONS

Barnett et al., "Epitaxial Growth of ZyN on Si (100)", Applied Physics Letter 53 (5), Aug. 1, 1988, pp. 400–402.

Choi et al., "Growth of Epitaxial TiN Thin Films on Si (100) By Reactive Magnetron Sputtering", J. Vac. Sci. Technol. B, vol. 9, No. 2, pp. 221–227 (Mar./Apr. 1991).

Chami et al. "Polarity Determination in Compound Semiconductors by Channeling: Application to Heteroepitaxy", Appl. Phys. Lett. 52(18), May 2, 1988, pp. 1502–1504.

"Orientation Selection in Heterostructure Epitaxy", IBM Technical Disclosure Bulletin, vol. 31, No. 2, Jul. 1988.

Chyi et al., "Molecular Beam Epitaxial Growth and Characterization of InSb on Si", Appl. Phys. Lett. 54(11), Mar. 13, 1989, pp. 1016–1018.

Lo et al., "Cation Microstructures on Flat and Stepped Si Surfaces: Guidance for Growing High-Quality GaAs on (100) Si Substrates", Appl. Phys. Lett. 52(17), Apr. 25, 1988, pp. 1386–1388.

J. Narayan, et al., "Epitaxial Growth of TiN Films on (100) Silicon Substrates by Laser Physical Vapor Deposition," Appl. Phys. Lett., 61(11):1290–1292 (Sep. 1992).

R. Chowdhury, et al., "Pulsed Laser Deposition of Epitaxial Si/TiN/Si(100) Heterostructures," Appl. Phys. Lett., 64(10):1236–1238 (Mar. 1994).

J. Narayan, et al., "Formation of Epitaxial and Textured Platinum Films on Ceramics–(100) MgO Single Crystals by Pulsed Laser Deposition," Appl. Phys. Lett., 64(16):1–4 (Apr. 1994).

T. Zheleva, et al., "Epitaxial Growth in Large-Lat-
(List continued on next page.)

Primary Examiner—William D. Larkins
Assistant Examiner—Alice W. Tang
Attorney, Agent, or Firm—Burns, Doane, Swecker & Mathis

[57] ABSTRACT

Epitaxial growth of films on single crystal substrates having a lattice mismatch of at least 10% through domain matching is achieved by maintaining $na_1$ within 5% of $ma_2$, wherein $a_1$ is the lattice constant of the substrate, $a_2$ is the lattice constant of the epitaxial layer and n and m are integers. The epitaxial layer can be TiN and the substrate can be Si or GaAs. For instance, epitaxial TiN films having low resistivity can be provided on (100) silicon and (100) GaAs substrates using a pulsed laser deposition method. The TiN films were characterized using X-ray diffraction (XRD), Rutherford back scattering (RBS), four-point-probe ac resistivity, high resolution transmission electron microscopy (TEM) and scanning electron microscopy (SEM) techniques. Epitaxial relationship was found to be <100> TiN aligned with <100> Si. TiN films showed 10–20% channeling yield. In the plane, four unit cells of TiN match with three unit cells of silicon with less than 4.0% misfit. This domain matching epitaxy provides a new mechanism of epitaxial growth in systems with large lattice misfits. Four-point probe measurements show characteristic metallic behavior of these TiN films as a function of temperature with a typical resistivity of about 15 $\mu\Omega$-cm at room temperature.

15 Claims, 7 Drawing Sheets

OTHER PUBLICATIONS tice-Mismatch System," *J. Appl. Phys., 75(2):860–871 (Jan. 1994).*

J. Narayan, et al., "Dislocations and Interfaces in Semiconductor Heterostructures," *Journal of Metals,* 41(4):10–15 (Apr. 1989).

Wittmer, "Properties and Microelectronic Applications of Thin Films of Refractory Metal Nitrides", *J. Vac. Sci. Technol. A,* vol. 3, No. 4, pp. 1797–1803 (Jul./Aug. 1985).

Gupta et al., "Materials for Contacts, Barriers and Interconnects", *Semiconductor International,* pp. 80–87 (Oct. 1989).

Hultman et al., "Transmission Electron Microscopy Studies of Microstructural Evolution, Defect Structure . . . Sputter Deposition", *Thin Solid Films,* 205 pp. 153–164 (May 1991).

Buinno et al. "Laser Deposition of Epitaxial Titanium Nitride Films on (100)MgO", *Appl. Phys. Lett.,* 55 (4), pp. 405–407 (Jul. 1989).

Singh et al., "Theoretical Model for Deposition of Superconducting Thin Films Using Pulsed Laser Evaporation Technique", *J. Appl. Phys.,* 68(1) pp. 233–247 (Jul. 1990).

Buinno et al., "Low Temperature Processing of Titanium Nitride Films by Laser Physical Vapor Deposition", *Appl. Phys. Lett.,* 54 (16) pp. 1519–1521 (Apr. 1989).

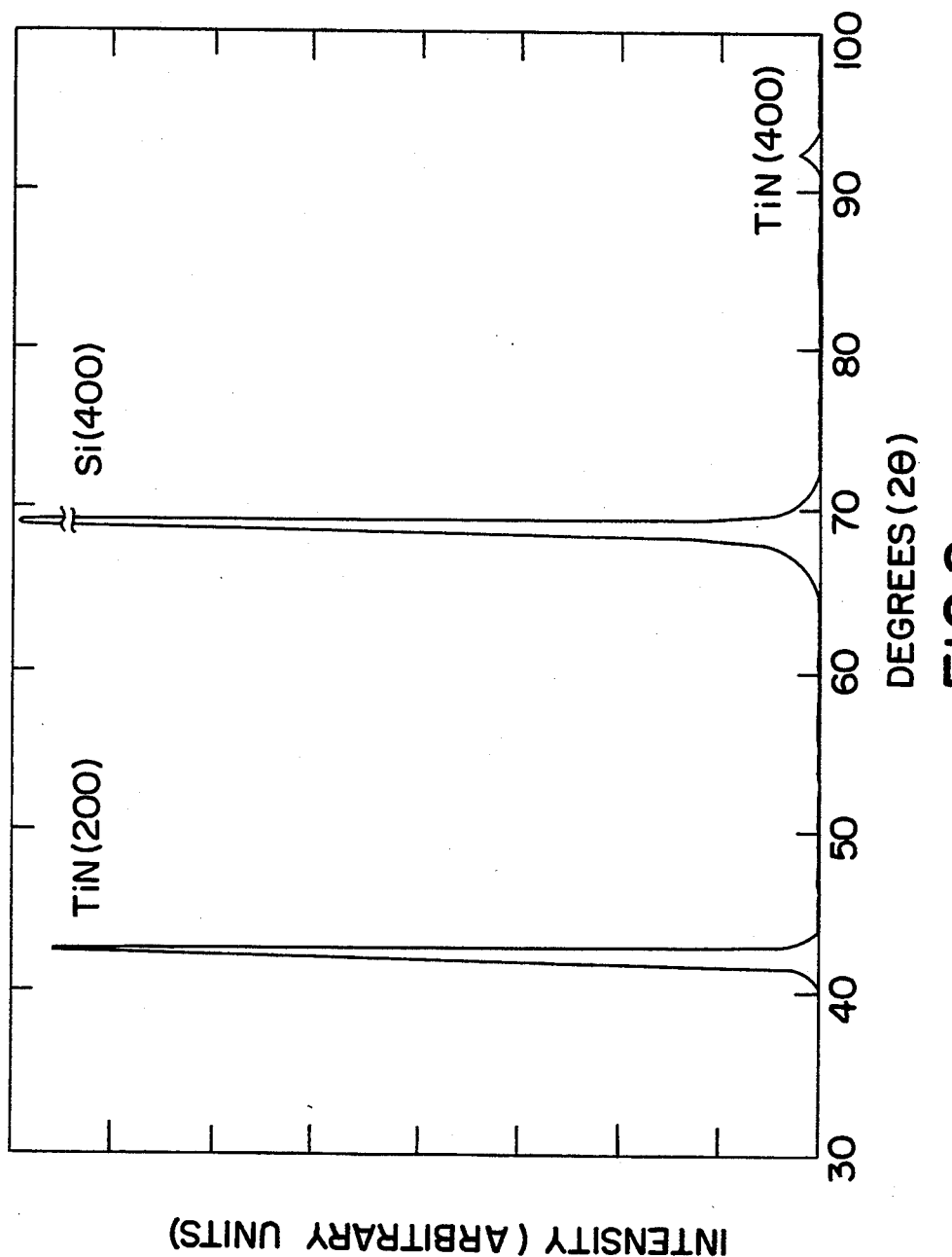

SINGLE CRYSTAL TITANIUM NITRIDE EPITAXIAL ON SILICON

BACKGROUND OF THE INVENTION

1 Field of the Invention

In general, the invention relates to a method of depositing an epitaxial layer on a single crystal substrate having greater than 10% lattice mismatch therebetween and a product produced thereby. More particularly, the invention relates to epitaxial growth of TiN on (100) silicon and growth of TiN on (100) GaAs.

2. Description Of Related Art

Titanium nitride films and coatings having polycrystalline microstructure have found applications ranging from corrosion and erosion resistance coatings to diffusion barriers in advanced integrated circuit devices to wavelength-selective films. (M. Wittruer, B. Studer, and H. Mechiar, *J. Appl. Phys.*, 52, 5772 (1981); B. Zega, M. Kornmann, and J. Amiquet, *Thin Solid Films*, 54, 577, (1977); and E. Vulkonen, T. Karlsson, B. Karlsson, and B. O. Johansson, *Proceedings of SPIE 1983 International Technical Conference*, 401, 41 (1983).)

Gupta et al. report that it is common to anneal wafers at 400°–450° C. after aluminum metalization in order to reduce contact resistance by dissolving native oxide on silicon, reduce metal defects and minimize interface state densities in MOS devices. (G. Gupta, J. S. Song and V. Ramachandran, "Materials for Contacts, Barriers and Interconnects", *Semiconductor International*, October 1989, 80–87.) In order to prevent problems with respect to diffusion of Si into the aluminum during such an anneal, a metal silicide layer is interposed between Al and Si in contacts. Silicides are usually formed by depositing a metal layer such as Pt, Pd, Co, Ni, Ti, Mo, W or Ta and reacting the metal with the Si in the contact windows to form a silicide. The noble and near-noble metal silicides such as PtSi, Pd$_2$Si, CoSi$_2$ and NiSi are used for devices with junction depths of at least 0.5 $\mu$m if post-aluminum deposition processing temperatures do not exceed 400° C. and are almost always used with a barrier. The barrier is used to prevent diffusion of Si into Al. TiN is considered an effective stable barrier used in silicon technology.

In bipolar and MOS integrated circuits wherein Al is used for interconnections, barrier layers of TiN have been proposed as diffusion barriers to prevent low temperature interdiffusion of aluminum and silicon during contact sintering, passivation or device packaging. (M. Wittmer, "Properties and microelectronic applications of thin films of refractory metal nitrides", *J. Vac. Sci. Technol. A*, Vol. 3, No. 4, 1797–1803, July/August 1985.). Wittmer reports that the resistivity of such TiN layers is 20–70 $\mu\Omega$cm and that a contact structure consists of a PtSi layer for ohmic contact to silicon, a TiN diffusion barrier layer on the PtSi layer and an aluminum top layer. Although aluminum melts at around 700° C., the TiN layer prevents interdiffusion after heat treatment at 600° C. for 30 min. Wittmer reports that another multilayer contact consists of TiSi$_2$ on Si, TiN on the TiSi$_2$ layer and Al on the TiN layer, such contacts remaining stable during heat treatments up to 550° C. Wittmer further reports that TiN on lightly n-doped Si forms a Schottky diode with a low barrier height of 0.49 V and TiN can also be used to form a low barrier diode on p-Si. In addition, TiN can be used as gate materials in MOS capacitors and transistors if the TiN is protected by a layer of poly-Si or SiO$_2$ to prevent oxidation of the TiN. In this case, if the poly-Si is doped it can serve as dopant source for the diffusion of source and drain regions of MOS transistors. For instance, TiN gate p-channel MOS transistors exhibit comparable performance to Al-polycrystalline Si gate MOS transistors.

In previous studies, polycrystalline TiN films were deposited by a variety of techniques: chemical vapor deposition, ion plating, activated reactive evaporation, dc, rf and magnetron sputtering. (M. Wittruer, *Appl. Phys, Lett.*, 36, 456 (1980); and N. W. Cheung, H. von Seefeld, M. A. Nicolet, F. Ho, and P. Iles, *J. Appl. Phys.*, 52, 4297 (1981).) The polycrystalline films tend to grow columnar with grain boundaries normal to the substrate. In the columnar structure, faster diffusion along the grain boundaries makes these films susceptible to environmental degradation and reduces their effectiveness as a diffusion barrier. The above problems in polycrystalline films can be solved by producing an equiaxed microstructure, where grain boundaries are randomized and direct fast diffusion paths between the interface and the free surface are eliminated.

Hultman et al. report growing single-crystal TiN films on MgO substrates by magnetron sputtering. (L. Hultman, G. Håkansson, U. Wahlström, J. E. Sundgren, I. Petrov, F. Adibi and J. E. Greene, *Thin Solid Films*, 205 (1991), 153– 164.) Hultman et al. report that TiN grown on steel had a polycrystalline columnar structure with open grain boundaries and faceted surfaces.

Polycrystalline TiN films with equiaxed-grain microstructure have been produced by laser physical vapor deposition (LPVD) in the temperature range 400°–500° C. on silicon substrates compared to higher temperatures (in excess of 900° C.) needed for chemical vapor deposition methods. (N. Biunno, J. Narayan, S. K. Hofmeister, A. R. Srivatsa, and R. K. Singh, *Appl, Phys. Lett.*, 54, 1519 (1989).) In addition, single crystal TiN films have been formed by LPVD on lattice-matched substrates such as MgO(100) in the temperature range 450° to 750° C. (N. Biunno, J. Narayan, A. R. Srivatsa, and 0. W. Holland, *Appl, Phys. Lett.*, 55,405 (1989).) The lattice mismatch between the TiN film and the MgO substrate is 1% and resistivity of the TiN was around 50 $\mu\Omega$cm or higher. Epitaxial growth of TiN thin films on (100) Si is reported by Choi et al but in actuality, the TiN film is textured since it only has one axis aligned. (C. H. Choi, L. Hultman, W. A. Chiou and S. A. Barnett, *J. Vac,Sci, Technol. B*, Vol. 9, No. 2, March/April 1991, 221–227.) Epitaxial films, however, have all three axes aligned.

Johansson et al. reported growth of single crystal TiN films on (111)MgO in the temperature range 600°–800° C. using a reactive magnetron sputtering technique. (B. 0. Johansson, J. E. Sundgren, J. E. Green, A. Rochett, and S. A. Barnett, *J. Vac, Sci. Technol.*, A3,303 (1985).) In LPVD, the epitaxial films have been obtained at a temperature as low as 450° C. The higher energy of laser evaporated species ~5–8 ev per particle compared to thermal evaporation (~0.1 ev per particle) is envisaged to enhance the surface mobility and provide recrystallization at a lower temperature. (For example, see Biunno et al. supra.)

There is a need in the art for a process capable of forming single crystal TiN (a=4.24 Å) films on lattice-mismatched substrates such as (100) silicon (a=5.43 Å) and GaAs (a=5.65 Å). (L. E. Toth, *Transition Metal Carbides and Nitrides* (Academic, N.Y., 1971).) Such a process would be expected to revolutionize the fabrication of advanced integrated circuits. Single crystal films could eliminate fast diffusion paths associated with grain boundaries and the low-resistivity of single crystal films could make them suitable for contact metallurgy such as ohmic contacts in advanced integrated circuit devices.

SUMMARY OF THE INVENTION

The invention provides a multilayer structure comprising a substrate of a material having a single crystal microstructure and lattice constant of $a_1$ and an epitaxial layer having a surface thereof in contact with a surface of the substrate, the epitaxial layer having a lattice constant of $a_2$, $a_1$ differing from $a_2$ by at least 10%. In addition, $na_1$ can differ from $ma_2$ by no greater than 5% wherein n and m are different integers.

Features of the TiN layer include a resistivity at room temperature of less than 20 $\mu\Omega$cm, more preferably about 15–16 $\mu\Omega$cm, alignment of [100] of the TiN layer with [100] of the silicon substrate, and <111> planes in the silicon substrate having a spacing of about 0.314 nm and being aligned with {111} planes having a spacing of about 0.244 nm in the TiN layer. The TiN layer can extend laterally over silicon containing layers such as silicon dioxide, polycrystalline Si, doped Si, undoped Si, amorphous Si, silicides or nitrides. The TiN layer preferably forms a smooth interface with the (100) silicon substrate, the interface having a surface roughness of no greater than 1 nm.

Lattice mismatch between the TiN layer and the Si substrate is about 22% whereas lattice mismatch between the TiN layer and GaAs is about 25%. The TiN layer can comprise an ohmic contact of a metal-oxide-semiconductor (MOS) and the TiN layer can have a thickness as small as 1 nm or as large as 5 $\mu$m.

The invention also provides a method of growing an epitaxial layer on a substrate by (i) providing a substrate having a single crystal microstructure and a lattice constant of $a_1$, (ii) providing a target material which has a lattice constant of $a_2$ when grown epitaxially, $a_1$ differing from $a_2$ by at least 10%, and (iii) exposing the target material to a beam of laser energy so as to evaporate the target material and deposit an epitaxial layer of the target material on the substrate. According to a preferred embodiment of the invention, $na_1$ differs from $ma_2$ by no more than 5% wherein n and m are integers. For instance, n can differ from m by 1. In the case where the substrate comprises (100) Si or (100) GaAs and the epitaxial layer comprises TiN, n=3 and m=4.

The method can include evacuating the chamber prior to forming the epitaxial layer and native oxide on substrates such as Si can be removed by wet etching (chemical), dry etching (ion/plasma) or by using only the laser beam.

The substrate can be heated to a temperature of at least 350° C. during formation of an epitaxial TiN layer. For instance, a (100) Si substrate can be heated to a temperature of no greater than 700° C. during formation of the epitaxial TiN layer. A GaAs substrate can be heated to a temperature no greater than 400° C. when forming the epitaxial TiN layer.

BRIEF DESCRIPTION OF THE DRAWINGS

FIG. 2(a) is a graph showing X-ray diffraction intensity versus incident angle plot showing (100) peaks from TiN film and (100) silicon substrate;

FIGS. 3(a–c) are selected area-diffraction patterns from the cross-section specimens of FIGS. 2(b–c) with the same camera length at different locations in the interface. In particular.

DETAILED DESCRIPTION OF THE PREFERRED EMBODIMENTS

Figure 1:
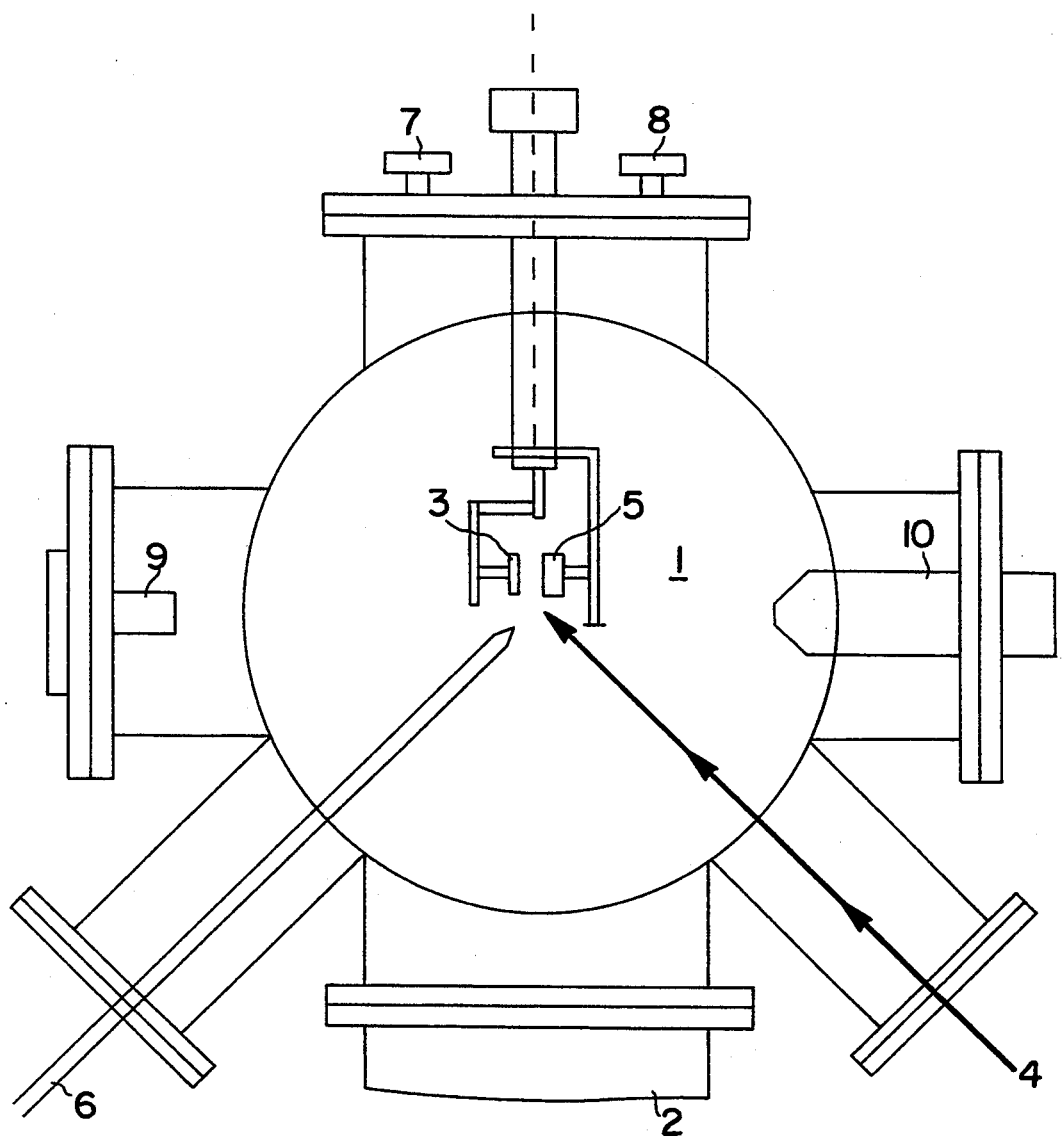
FIG. 1 shows an apparatus which can be used to prepare epitaxial TiN films in accordance with the invention.

According to the invention, it has been surprisingly and unexpectedly discovered that a new technique which (hereinafter referred to as "domain matching") allows epitaxial layers to be grown on substrates wherein lattice mismatch between the epitaxial layer and the substrate is greater than 10%. For instance, according to the invention, epitaxial TiN can be grown on substrates such as (100) Si (lattice mismatch about 22%) and (100) GaAs (lattice mismatch about 25%).

Domain matching refers to whole number matching within about 5% of integer multiples of lattice constants of the epitaxial film and the underlying substrate. For instance, the lattice constant of epitaxial TiN is about 4.24 Å and the lattice constant of (100) Si is about 5.43 Å. Using the domain matching theory, 4 lattice cells of TiN have a multi-cell parameter of $d_1$ of 16.96 whereas 3 lattice cells of Si have a multi-cell parameter $d_2$ of 16.29, $d_1$ and $d_2$ differing by less than 4%. Likewise, 3 lattice cells of (100) GaAs have a multi-cell parameter $d_3$ of 16.96, $d_1$ and $d_3$ differing by less than 0.25%. Thus, the novel concept of domain matching allows epitaxial layers to be grown on substrates having lattice mismatch of at least 10% provided that lattice constant $a_1$ of the substrate and lattice constant $a_2$ of the epitaxial layer differ by at least 10%. In addition, $na_1$ preferably differs from $ma_2$ by no greater than 5% wherein n and m are different integers.

According to the invention, epitaxial layers can be formed on lattice-mismatched substrates such as (100) silicon substrates or (100) GaAs substrates by laser physical vapor deposition. Deposition of the epitaxial TiN can be accomplished in the temperature range of 400°–700° C. for silicon substrates and 350°–400° C. for GaAs substrates. The resistivity of the epitaxial TiN was found to be low (15–17 $\mu\Omega$-cm), comparable to that of high-quality titanium silicide. As such, the epitaxial TiN of the invention can be used in contact metallurgy of integrated circuits. The epitaxial TiN can also be used as electrodes of shallow-junction (e.g., less than 0.1 $\mu$m depth) and high-efficiency solar cells. In addition, due to lateral growth of the epitaxial TiN, it is possible to provide the epitaxial TiN on materials such as silicon dioxide, polycrystalline Si, doped or undoped Si, glass, silicides, $Si_3N_4$ or other insulating semiconductive and electrically conductive polycrystalline materials.

According to the invention, laser physical vapor deposition can be carried out using a UV source to provide a laser beam having a wavelength of 0.308 $\mu$m, 0.248 $\mu$m or 0.193 $\mu$m, a pulse duration of $10-100 \times 10^{-9}$ sec and an energy density of 2-10 J/cm$^2$. In particular, laser physical vapor deposition of TiN was carried out using a pulsed KrF excimer laser (wavelength 248 nm, pulse duration $25 \times 10^{-9}$s, repetition rate 5 Hz). Details of this procedure are described in J. Narayan, N. Biunno, R. Singh, O. W. Holland and O. Auchiello, *Appl. Phys. Lett.*, 51, 1845 (1987) and R. K. Singh, J. Narayan, A. K. Singh, and C. B. Lee, *J. Appl. Phys.*, 67, 3448 (1990), the subject matter of which is hereby incorporated by reference. The target was hot-pressed stoichiometric TiN obtained from CERAC Inc. The laser beam was focussed to obtain energy density ~10 Jcm$^2$ at 45° angle of incidence. The target was held parallel to a (100) silicon substrate, which was cleaned ultrasonically 5 min. in acetone and 5 min. in methanol, followed by 5 min. in 10% HF to remove native oxide. Some of the samples were spin cleaned in a solution of HF:deionized water: ethanol in the ratio of 1:1:10 after UV exposure to obtain hydrogen terminated silicon surfaces. Alternatively, conventional wet (chemical) or dry (ion/plasma) etching procedures can also be used to clean the substrate. In addition, the substrate can be cleaned by using only the laser beam. For example, the target material can be held in a rotatable target holder having multiple target supports, each of which can hold a target material. A mirror can be mounted in one of the target supports and the laser beam can be reflected from the mirror to clean the substrate (e.g., remove native oxide from Si).

The deposition chamber was evacuated to a base pressure of about $1 \times 10^{-7}$ torr using a turbomolecular pump and depositions were carded out in the temperature range 350°-700° C. Some samples were deposited with TiN at 350° C. followed by high-temperature deposition. The deposition rate was typically 1.0 Å per second. A 20 min. deposition at 5 Hz resulted in approximately 100 nm thick TiN film. Epitaxial TiN can be grown to any desired thickness such as thicknesses as large as 5 $\mu$m. However, it is possible to grow an epitaxial TiN layer as thin as 1 nm.

A schematic diagram of a deposition system which can be used to form epitaxial TiN in accordance with the invention is shown in FIG. 1. The setup consists of a multiport chamber 1 in which high vacuum (~$10^{-6}$Torr) is maintained by means of a port 2 to a turbomolecular pump. The target 3 consists of stoichiometric TiN which is oriented at an angle of 45° to the incident laser beam 4. The evaporated material is deposited onto a silicon substrate 5 placed parallel and at a distance of about 3-5 cm away from the target. The deposition system shown in FIG. 1 includes a gas inlet 6, an electrical feedthrough 7, a thermocouple feedthrough 8, an ionization gauge 9 and a quadrupole mass spectrometer 10. The substrate temperature can be varied from room temperature to 800° C., although a temperature of 350°-700° C. is preferred to obtain epitaxial thin films. The thickness of the film depends on various parameters including the substrate-target geometry, pulse energy density, and number of pulses. The target and/or the laser beam can be rotated and/or translated with respect to the specimen and/or the specimen can be rotated and/or translated with respect to the target while keeping the laser beam stationary. As such, it is possible to grow epitaxial TiN films on 6 inch, 8 inch or even larger Si wafers.

In the case where (100) GaAs is the substrate, a wafer of (100) GaAs can be degreased by immersion in methanol for 5 min. followed by immersion in acetone for 5 min. The GaAs wafer can then be dipped in a mixture of $H_2SO_4:H_2O_2:H_2O$ in a volumetric ratio of 10:1:1 followed by rinsing in deionized water and ethanol and spin drying in flowing $N_2$.

Figure 2B:
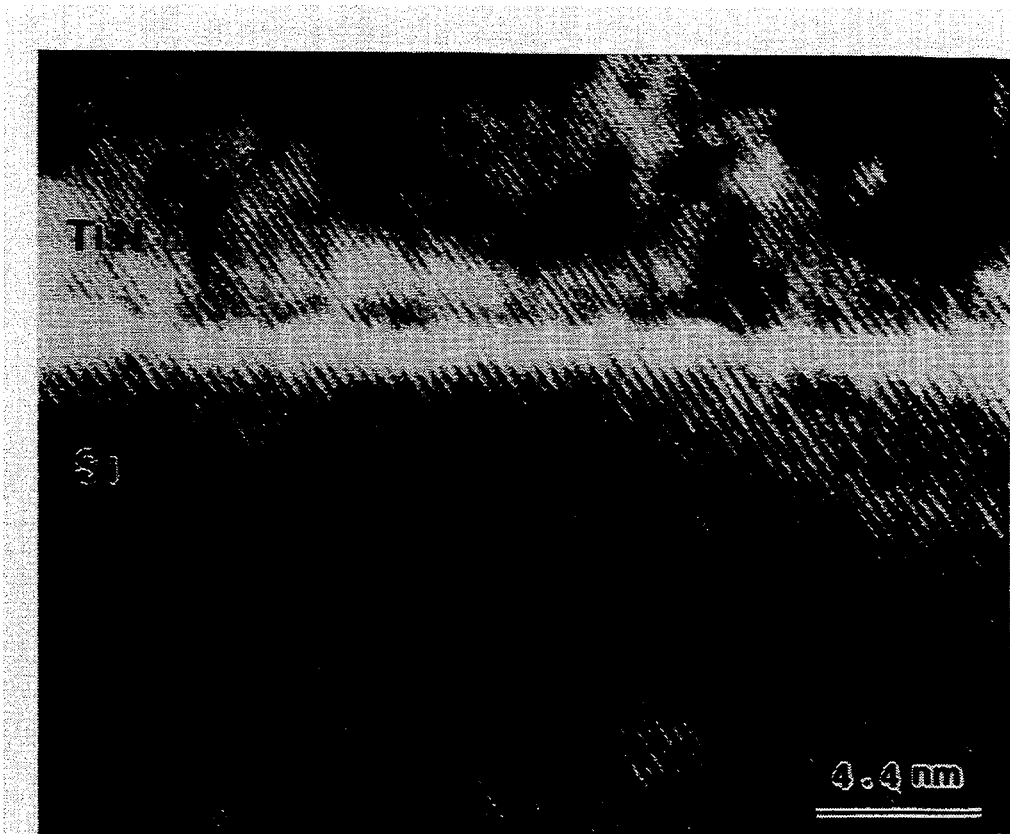
FIG. 2(b) is a high-resolution TEM micrograph from <110> cross-section showing {111} planes from silicon substrate and TiN film wherein the termination of planes associated with dislocations near the interfaces is clearly observed.

FIG. 2(*a*) is an X-ray diffraction trace of a TiN film on a (100) silicon substrate. The pattern contains (200) and (400) TiN along with (400) silicon diffraction spots indicating that the TiN film is textured with [100] of TiN aligned with [100] of silicon. The lattice constant of TiN from this trace was determined to be 4.2413 Å. It should be noted that FIG. 2(*a*) only provides information with respect to one crystallographic direction. As such, the alignment in that one direction indicates that the TiN is at least textured (i.e., alignment in one direction). However, the following electron microscopy results show that the TiN layer showed alignment in all three crystallographic directions. As such, the TiN was epitaxial rather than textured.

In order to study the inplane alignment of the TiN film with respect to the silicon substrate and epitaxial nature, cross-section specimens were prepared and studied using a high-resolution Akashi 002B instrument. FIG. 2(*b*) is a high resolution transmission electron micrograph containing a TiN/Si interface with <110> normal to the specimen. The interface between the TiN and (100) silicon substrate was found to be very smooth (e.g., roughness less than 1 nm) and free from any perceptible interdiffusion.

On the other hand, silicides such as $TiSi_2$ can result in a rough surface at the interface between the silicide and the substrate. Thus, the smooth interface obtained in accordance with the invention will allow reduction in junction depth of CMOS devices. For instance, for a device size of 0.5 $\mu$m, the epitaxial TiN will allow contacts with shallow junctions having depth of less than 0.1 $\mu$m. This will result in half a billion CMOS devices on a 1 cm$^2$ chip.

The <111> planes in silicon with 0.314 nm spacing are aligned with {111} TiN planes with 0.244 nm spacing. The dislocations associated with extra half planes terminating at the interface are clearly observed at the interface. These dislocations relieve some of the lattice misfit strain between the TiN layer and the silicon substrate.

Figure 2C:
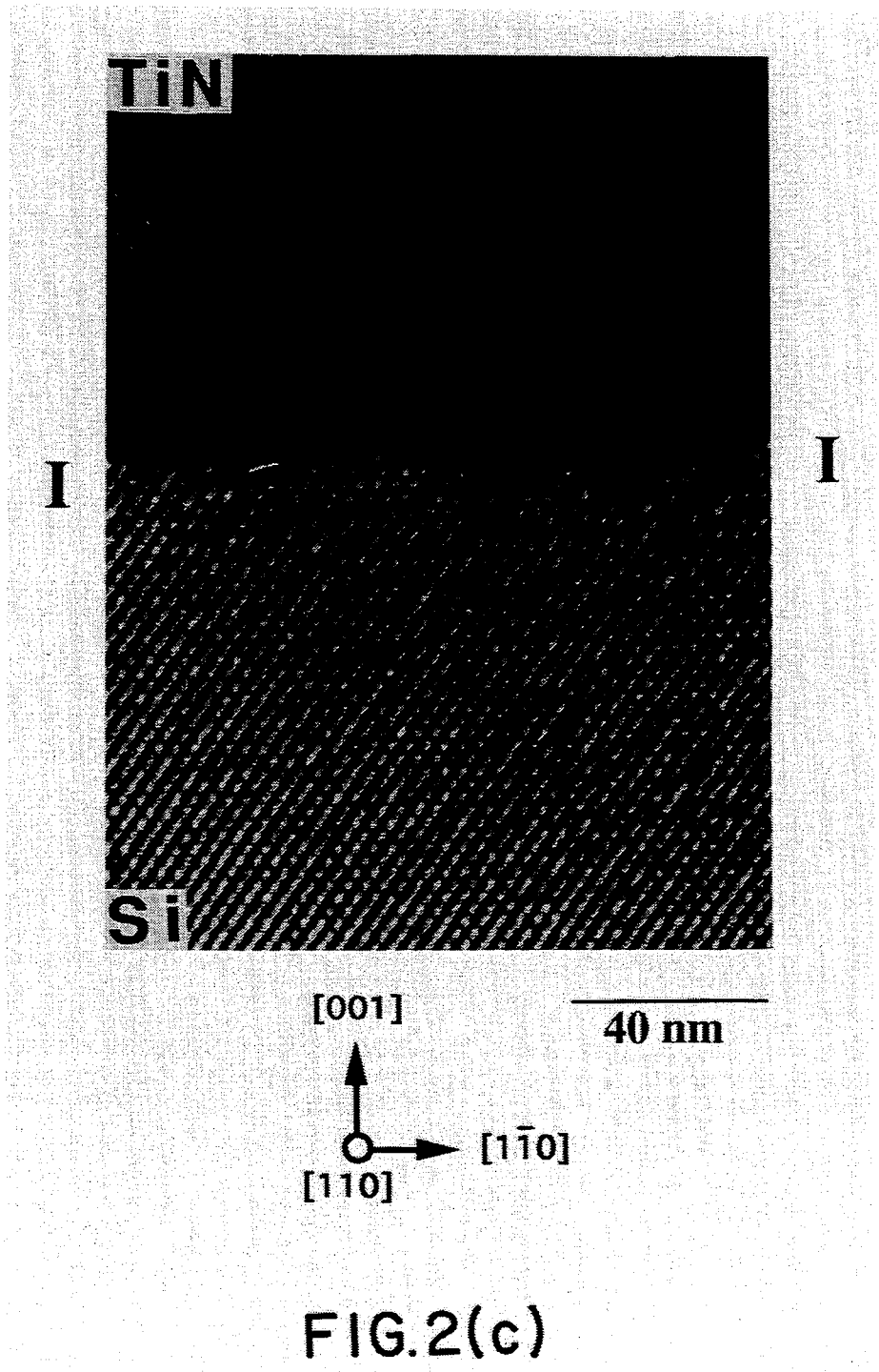
FIG. 2(c) is a higher resolution TEM micrograph than FIG. 2a and reveals both sets of {111} planes lying parallel to the electron beam.

FIG. 2(c) shows a high resolution TEM micrograph from another area where both sets of {111} planes in Si and TiN are clearly visible. The micrograph clearly shows epitaxial growth even in the presence of interfacial oxide layer. This may occur as a result of lateral epitaxy originating from pinholes and growing over the surrounding thin oxide layer. Although the film is epitaxial, it contains a high density of dislocations.

Figure 3A:
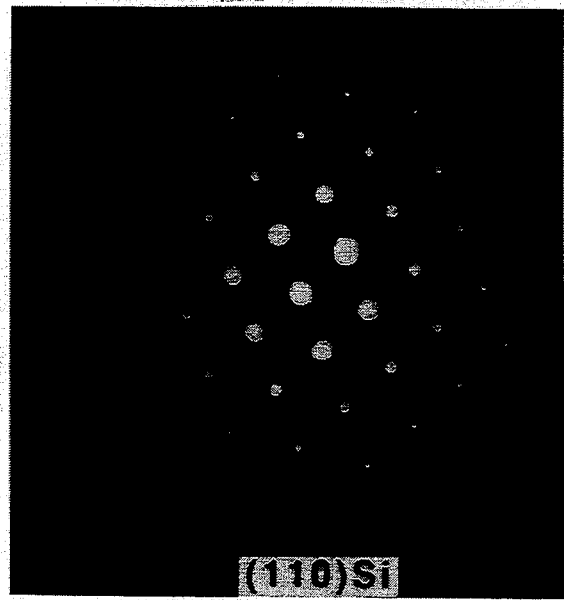
FIG. 3(a) shows Si(110)
Figure 3B:
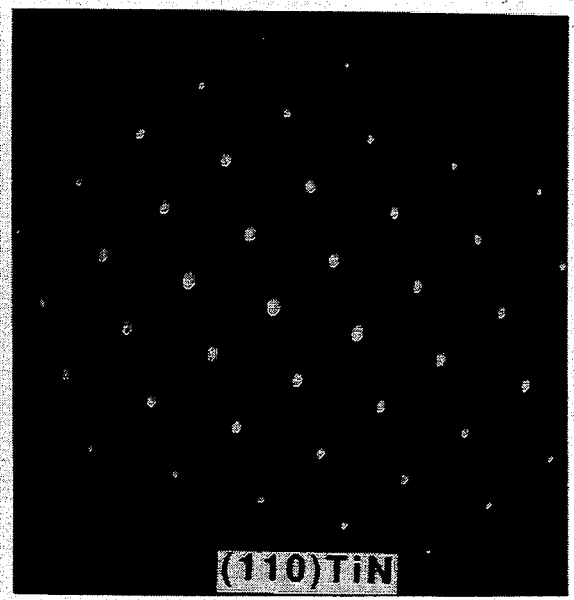
FIG. 3(b) shows TiN(110) and FIG. 3(c) shows interface containing both Si(110) and TiN(110)
Figure 3C:
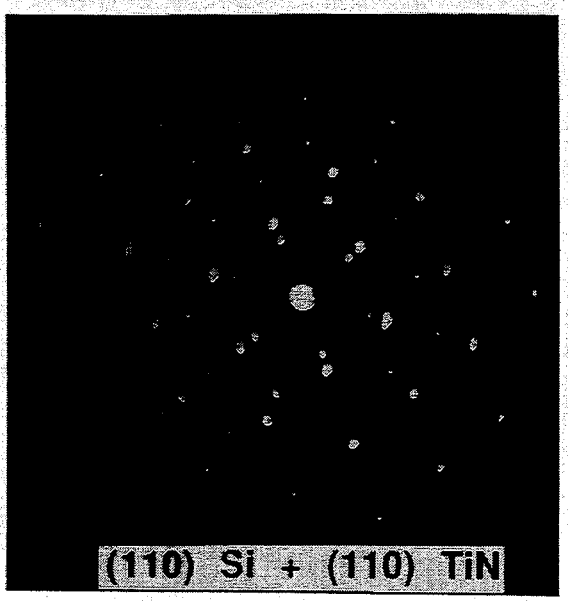

FIGS. 3 (*a-c*) show selected area-diffraction (SAD) patterns of silicon (FIG. 3*a*), titanium nitride (FIG. 3*b*), and the interfaces of TiN and Si (FIG. 3*c*) from (110) cross-section specimens. The TiN and Si diffraction spots aligned with respect to each other where fourth order diffraction spot of TiN matches with less than 4% with third order diffraction spots of the silicon substrate. These patterns clearly establish cube-on-cube alignment between the TiN layer and the silicon substrate.

Figure 4:
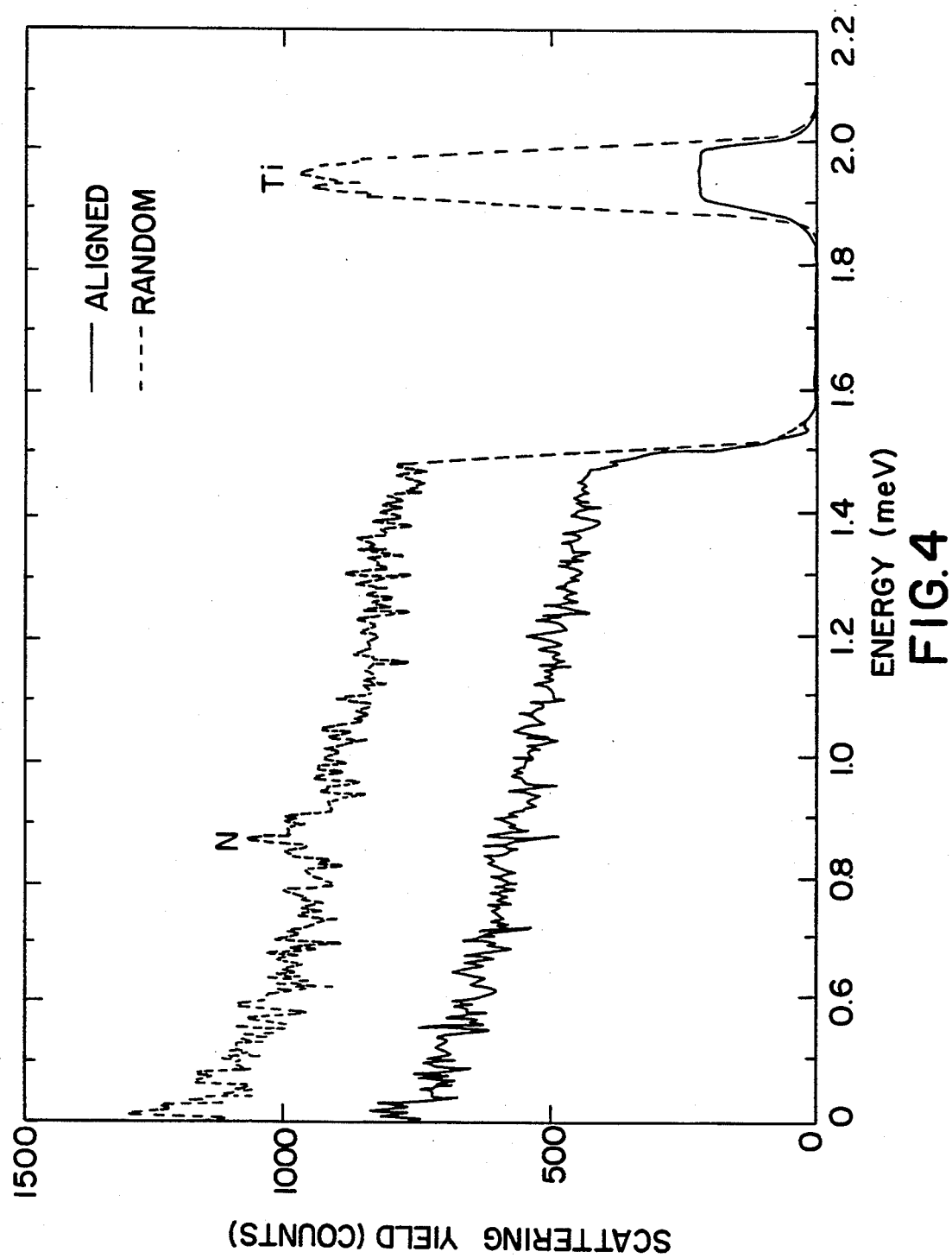
FIG. 4 shows a graph of RBS spectra of TiN film on (100)Si substrate in aligned and random directions. The minimum yield suggests that epitaxial TiN has grown over the (100)Si substrate.

FIG. 4 shows RBS spectra (random and aligned) from the above specimens. The $X_{min}$ value (the ratio of random to aligned channeling yield) was found to be 10–20% indicating epitaxial films with a high density of defects, consistent with TEM observations. From a fit between calculated and observed spectra, the composition of the film was determined to be close to the stoichiometric TiN.

Figure 5:
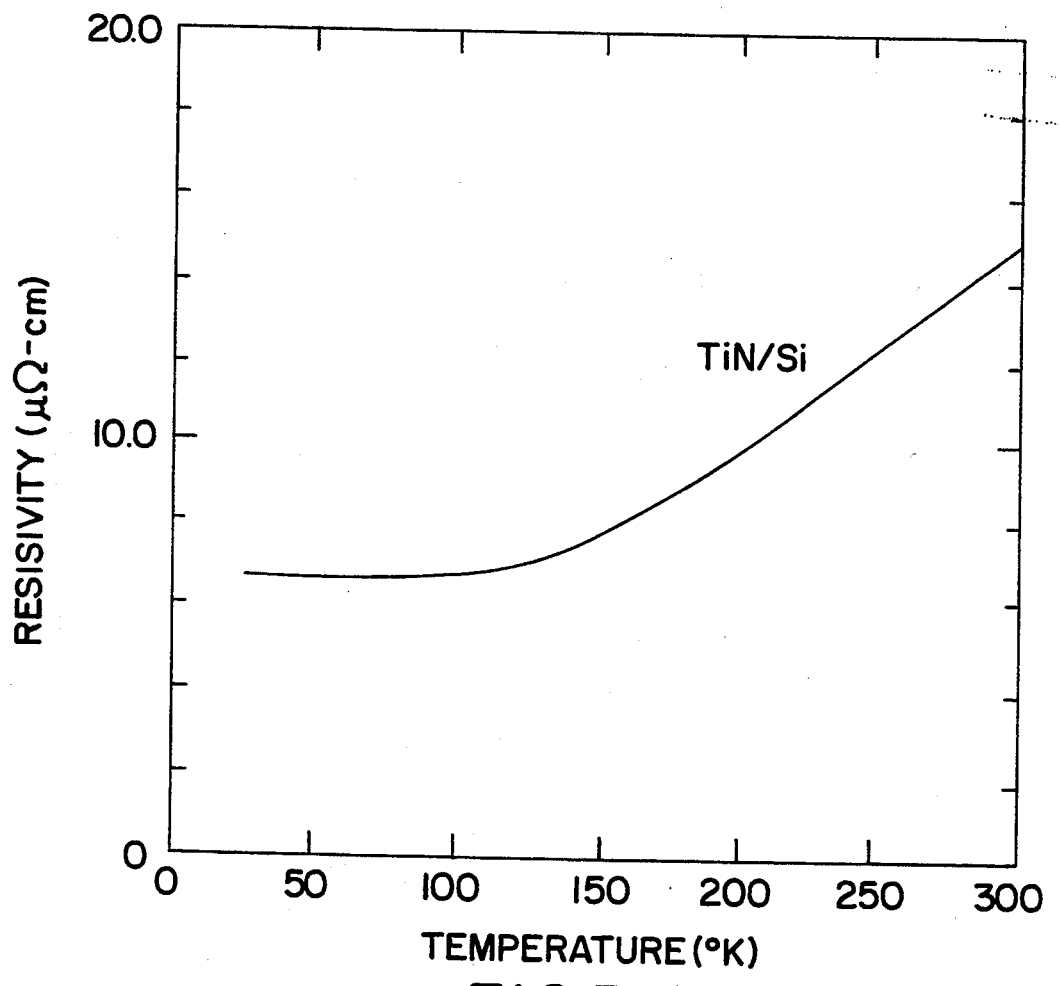
FIG. 5 is a graph of resistivity as a function of temperature of TiN films.

Resistivity vs. temperature measurements on the TiN film were carried out by using the standard four-point probe ac resistivity method as shown in FIG. 5. Room temperature resistivity of the TiN thin film on Si(100) is about 15 $\mu\Omega$cm. This value is an order of magnitude lower than those reported for polycrystalline thin films (~150 $\mu\Omega$cm). (N. Biunno, J. Narayan, S. K. Hofmeister, A. R. Srivatsa, and R. K. Singh, *Appl. Phys. Lett.*, 54, 1519 (1989); B. O. Johansson, J. E. Sundgren, J. E. Green, A. Rochett, and S. A. Barnett, *J, Vac. Sci. Technol.*, A3, 303 (1985); J. M. Poitevin, G. Lemperiere, J. Tardy, *Thin Solid Films*, 97, 69 (1982); and J. E. Sungen, *Thin Solid Films*, 128, 21 (1985)).

The resistivity values of TiN thin films were found to decrease with temperature. This observation is consistent with the behavior of metals, except at low temperatures were a temperature independent value was obtained for these nitride films. This resistivity is termed as residual resistivity $\rho_{res}$, and is interpreted to be due to lattice imperfections such as impurity atoms, vacancies, or dislocations. According to Matthiessen's rule, the total resistivity consists of impurity and defect components $\rho_{imp}$ and $\rho_{defect}$. $\rho_{imp}$ is the resistivity associated with impurity atoms and, at small concentrations of impurities, $\rho_{imp}$ is expected to vary linearly with concentration. $\rho_{defect}$, which corresponds to the residual resistivity due to physical defects in the lattice, is dependent on the number of lattice defects which in turn depends on the processing conditions and annealing treatments. The resistivity of epitaxial TiN films was determined to be approximately 15 $\mu\Omega$-cm which is close to that of the titanium silicide (C54) phase. (P. Tiwari, M. Longo, G. Matera, S. Sharan, P. L. Smith, and J. Narayan, *J, Electronic Materials*, 20, 775 (1991)). Such low resistivity films can be used for forming ohmic contacts in the source and the drain regions. Further advantages derived from these TiN films include lower diffusivity of dopants through TiN (diffusion barrier characteristics) and absence of grain boundaries which provide fast diffusion paths.

Figure 6:
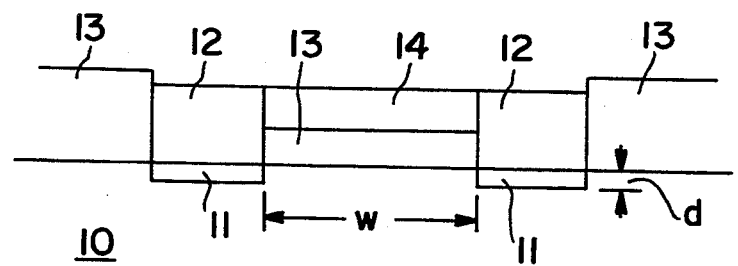
FIG. 6 shows the epitaxial TiN can be used as a diffusion barrier and contact material.

In conclusion, epitaxial TiN films can be grown on (100) silicon substrates and GaAs with cube on cube <100> alignments. Under these conditions three units of silicon are found to match with four units of TiN with less than 4% mismatch. The resistivity of these epitaxial films was approximately 15 $\mu\Omega$cm, which is comparable to that of TiSi$_2$ (C-54 low resistivity phase). Thus, the epitaxial TiN films can be directly used for ohmic contacts and contact metallurgy in advanced integrated circuits. The TiN epitaxial layer can thus be substituted for the Al/TiN/TiSi$_2$ layers currently being used on silicon substrates. With diffusion barrier characteristics far superior to that of TiSi$_2$ and with sharp and smooth TiN/Si interfaces, it is envisaged that this TiN contact metallurgy will play a dominant role in advanced integrated circuits requiring shallow junctions. For instance, as shown in FIG. 6, junction depths (d) are typically about 20% of device size (w). As such, in order to decrease device size (w) to 0.5 $\mu$m, it is necessary to decrease junction depth (d) to 0.1 $\mu$m. This is not possible with conventional metallurgy wherein silicides are deposited on doped silicon since irregularities in the interface between the silicide and the silicon can cause short circuiting with such shallow junction depths. On the other hand, the smooth interface formed by epitaxial TiN on (100) Si according to the invention will allow junction depths (d) of 0.1 $\mu$m and lower to be attained.

As shown in FIG. 6, the epitaxial TiN according to the invention can be used as a diffusion barrier and contact material. In particular, a p-doped (100) Si substrate 10 includes n-doped regions 11, epitaxial TiN contacts 12, SiO$_2$ regions 13 and polycrystalline Si 14. To provide a gate electrode, the epitaxial TiN can be grown laterally from regions 12 over the polysilicon layer 14 and later etched to provide a desired contact pattern.

Subsequent semiconductor and/or superconductor epitaxial structures on TiN can be used for three-dimensional integration of electronic devices. For instance, YBa$_2$Cu$_3$O$_{7-\delta}$ (epitaxial) superconducting and Pb$_{0.52}$Zr$_{0.48}$TiO$_3$ (epitaxial and textured) ferroelectric thin films can be grown on TiN/Si substrates, where TiN can serve as an electrode. Such multilayer structures are expected to play a prominent role in high-temperature superconductor and ferroelectric integrated circuit technology.

While the invention has been described with reference to the foregoing embodiments, various changes and modifications can be made thereto which fall within the scope of the appended claims.

What is claimed is:

1. A multilayer structure comprising:
    a substrate of a semiconductor material having a lattice constant of a$_1$, the substrate having a single crystal structure; and
    an entirely epitaxial metallic thin film layer free of grain boundaries and having a lattice constant of a$_2$, the epitaxial layer having a surface thereof in contact with a surface of the substrate, a$_1$ differing from a$_2$ by at least 10%.

2. The multilayer structure of claim 1, wherein na$_1$ differs from ma$_2$ by no greater than 4% wherein n and m are different integers.

3. The multilayer structure of claim 1, wherein the epitaxial layer comprises an epitaxial TiN layer.

4. The multilayer structure of claim 3, wherein the epitaxial TiN layer has a resistivity at room temperature of no greater than 20 $\mu\Omega$cm.

5. The multilayer structure of claim 3, wherein the epitaxial TiN layer has a resistivity at room temperature of no greater than 16 $\mu\Omega$cm.

6. The multilayer structure of claim 3, wherein the substrate comprises Si.

7. The multilayer structure of claim 3, wherein the substrate comprises GaAs.

8. The multilayer structure of claim 3, wherein the epitaxial TiN layer extends laterally over silicon dioxide, polycrystalline Si, doped Si, undoped Si, amorphous Si, or glass.

9. The multilayer structure of claim 3, wherein the epitaxial TiN layer extends laterally over a polycrystalline silicide layer or Si$_3$N$_4$.

10. The multilayer structure of claim 3, wherein the epitaxial TiN layer comprises an ohmic contact.

11. The multilayer structure of claim 3, wherein the epitaxial TiN layer comprises an electrode.

12. The multilayer structure of claim 3, wherein the epitaxial TiN layer has a thickness of at least 1 nm.

13. The multilayer structure of claim 2, wherein n and m differ by 1.

14. The multilayer structure of claim 6, wherein the epitaxial TiN layer forms a smooth interface with the silicon substrate, the interface having a surface roughness of no greater than 1 nm.

15. The multilayer structure of claim 13, wherein n=3 and m=4.

* * * * *